(12) United States Patent  
Kim

(10) Patent No.: US 6,333,066 B1
(45) Date of Patent: *Dec. 25, 2001

(54) METHOD FOR FORMING PZT THIN FILM USING SEED LAYER

(75) Inventor: Dae-sig Kim, Sungnam (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,762

(22) Filed: Nov. 20, 1998

(30) Foreign Application Priority Data

Nov. 21, 1997 (KR) .................................. 97-62034
Mar. 9, 1998 (KR) .................................. 98-7734

(51) Int. Cl.$^7$ .................................................. C23C 16/40
(52) U.S. Cl. .............................. 427/126.3; 427/255.35; 427/255.36; 427/255.7; 427/79; 427/100; 204/192.1; 204/192.18
(58) Field of Search .................... 427/100, 240, 427/255.35, 255.36, 255.7, 126.3, 79; 204/192.1, 192.18

(56) References Cited

U.S. PATENT DOCUMENTS

| | | | |
|---|---|---|---|
| 5,500,988 | * | 3/1996 | Moynihan et al. .................. 427/100 |
| 5,817,170 | * | 10/1998 | Desu et al. ........................ 427/126.3 |
| 5,820,946 | * | 10/1998 | Kim et al. ......................... 427/126.3 |
| 5,876,503 | * | 3/1999 | Roeder et al. ..................... 427/255.23 |
| 6,080,593 | * | 6/2000 | Kim et al. ............................... 438/3 |
| 6,190,728 | * | 2/2001 | Suzuki et al. ..................... 427/126.3 |
| 6,211,035 | * | 4/2001 | Moise et al. ......................... 438/396 |
| 6,229,166 | * | 5/2001 | Kim et al. ............................. 257/295 |

FOREIGN PATENT DOCUMENTS 0222711 8/1996 (JP).
1012832 1/1998 (JP).

* cited by examiner

*Primary Examiner*—Bret Chen
(74) *Attorney, Agent, or Firm*—Rothwell, Figg, Ernst & Manbeck

(57) ABSTRACT

A method for forming a PZT (lead zirconate titanate: $Pb(Zr_xTi_{1-x})O_3$) thin film using a seed layer is provided. In the method for forming a PZT thin film, PZT is grown on a PbO seed layer or a PZT seed layer of a perovskite phase formed by injecting excess Pb. The PbO seed layer or the PZT seed layer of a perovskite phase facilitates creation of perovskite PZT nuclei, thereby growing small and uniform PZT grains consisting of a perovskite phase.

20 Claims, 8 Drawing Sheets

METHOD FOR FORMING PZT THIN FILM USING SEED LAYER

BACKGROUND OF THE INVENTION

1. Field of the Invention

The present invention relates to a method for forming a PZT (lead zirconate titanate: $Pb(Zr_xTi_{1-x})O_3$) thin film, and more particularly, to a method for forming a PZT thin film using a seed layer.

2. Description of the Related Art

FIG. 1 is a cross-sectional view of a general PZT capacitor formed such that a PZT thin film is deposited on an electrode. The PZT thin film has good pyroelectricity, piezoelectricity and ferroelectricity and is widely employed for use in sensors, piezoelectric elements and memory devices. As shown in FIG. 1, a PZT thin film 14 is formed on a Pt electrode 13. In FIG. 1, reference numeral 11 denotes a Si substrate, reference numeral 12 denotes a $SiO_2$ insulation layer, and reference numeral 15 is an upper Pt electrode. Here, in order for the PZT thin film 14 to exhibit a ferroelectric property, the PZT thin film 14 must have a phase having a special crystal structure, that is, a perovskite crystal structure. Lead (Pb) must be supplied sufficiently in an initial stage of seed formation in order to properly form a perovskite phase on a substrate made of a metal such as platinum (Pt). If Pb is not sufficiently supplied, it is difficult to form an initial thin film having a perfect perovskite phase, the initial thin film formed at an interface between a thin film and a substrate. Instead, the initial thin film may have both a pyrochlore phase and a perovskite phase.

FIG. 2 is a scanning electron microscopy (SEM) photograph illustrating the cross-section of the crystal structure of a PZT thin film 24 in the case when the PZT thin film 24 is formed on a Pt electrode 23 which is most widely utilized as an electrode. Here, the Pt electrode 23 is formed on a Si substrate 21 having a $SiO_2$ insulation layer 22 coated thereon. As shown, since the PZT thin film 24 has different-sized grains, the surface of the PZT thin film 24 is rough due to protruding large grains. Such different grain sizes are attributed to different growth rates of the respective grains. In more detail, the grains grow at different growth rates according to their crystal orientation. It is known that the growth rate of PZT is highest in a <100> orientation, which is perpendicular to the surface of a substrate, and is lowest in a <111> orientation. Also, of the same orientation crystals, an earlier generated grain starts to grow earlier and thus is larger than a later generated grain, which is prominent in the case of a low nucleation density.

Also, in this case, the grain size is made larger than that in the case of a high nucleation density, so that the height of a protrusion becomes larger.

Also, the surface of the Pt electrode 23 is in good condition before pre-heating, as shown in FIG. 3A. However, the surface of the Pt electrode 23 becomes defective after pre-heating at 600° C. for about 15 minutes, as shown in FIG. 3B, due to a difference between a deposition temperature and a pre-heating temperature. In other words, in the process of pre-heating, the Pt thin film experiences grain growth, thermal expansion/contraction, diffusion, oxidation, etc. It will also have larger grains, more intercrystalline defects, and a more rough surface all of which are impediments to the growth of the PZT thin film.

If the surface of the PZT thin film becomes rough by the above impediments, it is difficult to proceed with subsequent processes for device fabrication. Further, if an interface between the PZT thin film and an upper electrode becomes severely rough, the performance of a capacitor is degraded accordingly.

To date, in order to overcome such problems, there have been attempts to manufacture a seed layer by forming a uniform amorphous thin film at a low temperature and crystallizing the same through subsequent heat treatment, or to deposit a good thin film made of only a perovskite phase by facilitating generation of a perovskite seed by thinly depositing a material such as $PbTiO_3$ as a seed layer and then depositing a PZT thin film thereon.

However, in the case when the amorphous phase is crystallized to be used as a seed, perfect crystallization of the amorphous phase cannot be achieved due to problems of composition change or recrystallization. Thus, since the amorphous phase remains between the substrate and the PZT thin film, the quality of the capacitor is deteriorated. Also, in the case of using $PbTiO_3$, the generation of a seed is facilitated, compared to the case where PZT is directly deposited on a Pt substrate. However, since it is difficult to prepare high quality $PbTiO_3$ and the surface of the thin film is rough, $PbTiO_3$ is not suitable as a seed layer.

SUMMARY OF THE INVENTION

To solve the above problems, it is an objective of the present invention to provide a method for forming a PZT thin film using a seed layer, in which a dense PZT thin film made of small grains is formed by growing the PZT thin film using a PbO thin film as a seed layer.

Accordingly, to achieve the above objective, there is provided a method for forming a PZT thin film using a seed layer, comprising the steps of forming an electrode on a substrate, forming a PbO seed layer on the electrode by injecting a Pb precursor into a chamber, and forming a PZT thin film on the PbO seed layer.

In the present invention, the electrode is formed of platinum (Pt), the step of forming the PbO seed layer is performed using a metal organic chemical vapor deposition method or a sputtering method, and the PbO seed layer is deposited at a temperature of 400–500° C. to a thickness of 50–500 nm.

Also, in the step of forming the PbO seed layer, Zr and Ti precursors are simultaneously injected into the chamber in addition to the Pb precursor using the metal organic chemical vapor deposition method, to form a PZT seed layer, where excess Pb is injected into the chamber such that the injection ratio of Pb to Zr and Ti, Pb/(Zr+Ti), for forming the seed layer, is greater than that for forming the PZT thin film.

BRIEF DESCRIPTION OF THE DRAWINGS

The above objectives and advantages of the present invention will become more apparent by describing in detail a preferred embodiment thereof with reference to the attached drawings in which:

FIGS. 4 through 6 are diagrams illustrating processing steps in a method for forming a PZT thin film using a seed layer according to the present invention, in which FIG. 4 is a cross-sectional view obtained after a general Pt substrate, FIG. 5 is a cross-sectional view obtained after a PbO seed layer is coated on the Pt substrate shown in FIG. 4, and FIG. 6 is a cross-sectional view obtained after a PZT thin film is formed on the seed layer shown in FIG. 5;

DESCRIPTION OF THE PREFERRED EMBODIMENTS

Hereinbelow, a method for forming a PZT thin film using a seed layer according to the present invention will be described with reference to the accompanying drawings.

According to a first embodiment of the present invention, a PbO thin film is first formed as a seed layer, and then PZT is grown thereon. As described above, a PbO seed layer is used at an interface between the PZT and a Pt electrode, thereby forming a PZT thin film in which small grains are densely packed by facilitating nucleation of a perovskite PZT phase. In other words, since the nucleation of a perovskite PZT phase is facilitated on the PbO seed layer at the early stage of PZT thin film growth, several changes occur to the final PZT thin film; a grain size of the thin film becomes small, creation of foreign matter such as pyrochlore is suppressed, and uniformity of the film is improved over the substrate. Also, since the PZT thin film consists of small grains because of high density of PZT nuclei, the surface roughness thereof is improved. Furthermore, the PbO thin film used as a seed layer serves to protect the Pt substrate underneath the PbO thin film, deformation of the substrate due to heat change before and after processing is suppressed.

Figure 4:
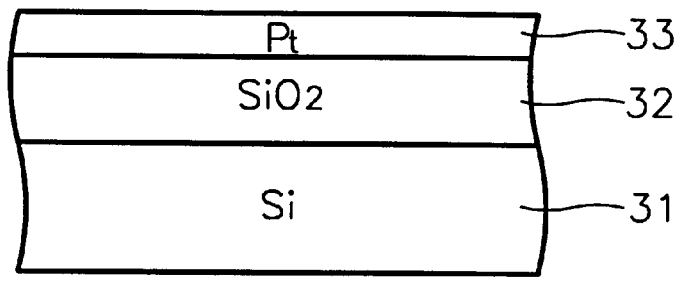
Figure 5:
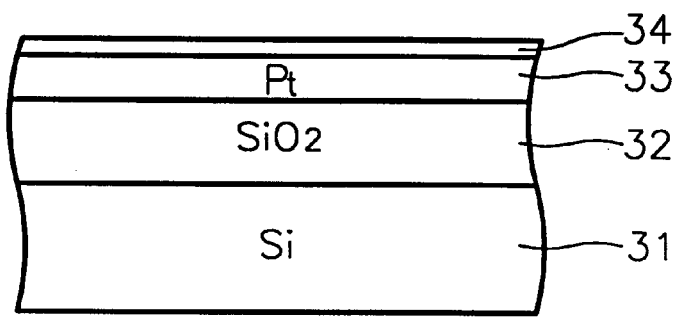
Figure 6:
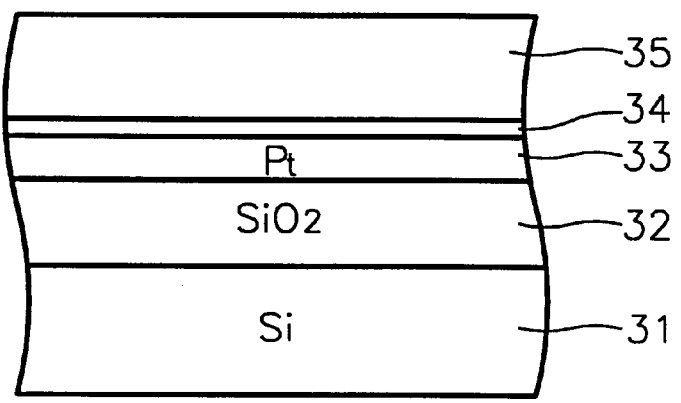

FIGS. 4 through 6 are diagrams illustrating processing steps in a method for forming a PZT thin film using a seed layer according to the present invention, in which the same reference numerals denote layers made of the same material.

First, as shown in FIG. 4, a SiO$_2$ insulation layer 32 is formed on a substrate 31, and an electrode 33 is formed thereon. Generally, Si grown from the SiO$_2$ insulation layer 32 is used as the substrate 31, and platinum (Pt) is used as the electrode 33. Here, the Pt electrode 33 is deposited on the SiO$_2$/Si layers 32 and 31 using a sputtering method. In this case, the structure of the Pt electrode, such as orientation, grain sizes, surface roughness and density can be varied by changing deposition conditions. Moreover, the variation in Pt structure may affect thermal endurance of the Pt electrode 33. In other words, when deposition of PZT is performed at a high temperature, the Pt electrode 33 is thermally deformed while it experiences grain growth, thermal expansion/contraction, diffusion, oxidation, etc. The less the Pt electrode 33 is thermally deformed, the more stably the PZT thin film can be deposited. Alternatively, instead of the Pt electrode 33, a buffer layer may be formed of a material such as TiO$_2$ and then a PZT thin film using a PbO seed layer is formed thereon.

Next, as shown in FIG. 5, a PbO seed layer 34 is formed on the Pt electrode 33. Here, a sputtering method or a metal organic chemical vapor deposition (MOCVD) method is used for forming the PbO seed layer 34. The thickness of the PbO seed layer 34 must be uniform and the surface thereof must be smooth. Preferably, the thickness of the PbO seed layer 34 is 5–50 nm, more preferably 20–30 nm. Also, in order to obtain the PbO seed layer 34 having a smooth surface, it is preferred to deposit PbO at a processing temperature of 420–480° C. under a processing Pressure of 5–10 Torr, in the case of using the MOCVD method.

Next, as shown in FIG. 6, a PZT thin film 35 is deposited on the Pt electrode 33 having the PbO seed layer 34 coated thereon using the MOCVD method. Here, the PbO seed layer helps a perovskite-phase nucleus of PZT to be created so that the PZT thin film 35 consists of a good-quality perovskite phase, without foreign matter such as a pyrochlore phase. Also, if the creation density of the perovskite-phase nuclei of PZT is increased, the grain sizes are reduced, which makes the PZT thin film 35 more denser. A dense thin film obstructs current flow through the grain boundary, which reduces leakage current of a PZT thin film. Also, since small grains are exposed to the surface of the PZT thin film, the surface roughness of the thin film is improved. Here, some of the PbO seed layer 34 may be evaporated during about 15 minute pre-heating process for deposition of the PZT thin film 35, occurring at a temperature of 550–750° C., or absorbed into PZT during growth of the PZT thin film. In the course of this process, the Pt electrode in the lower portion thereof is protected by the PbO seed layer but the PbO seed layer itself becomes very thin or vanishes. This will be described in more detail by way of example.

Figure 1:
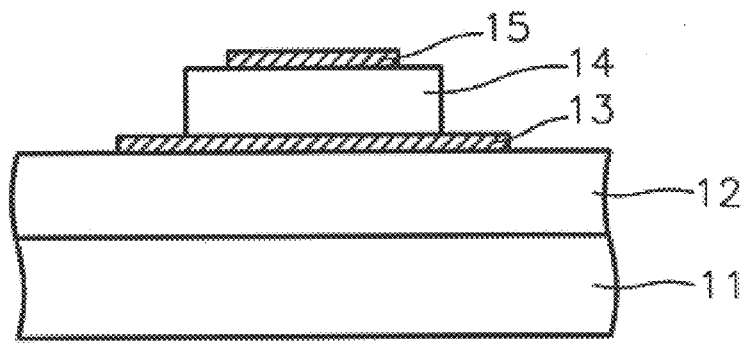
FIG. 1 is a cross-sectional view illustrating a general PZT thin film formed on a substrate or an electrode.
Figure 2:
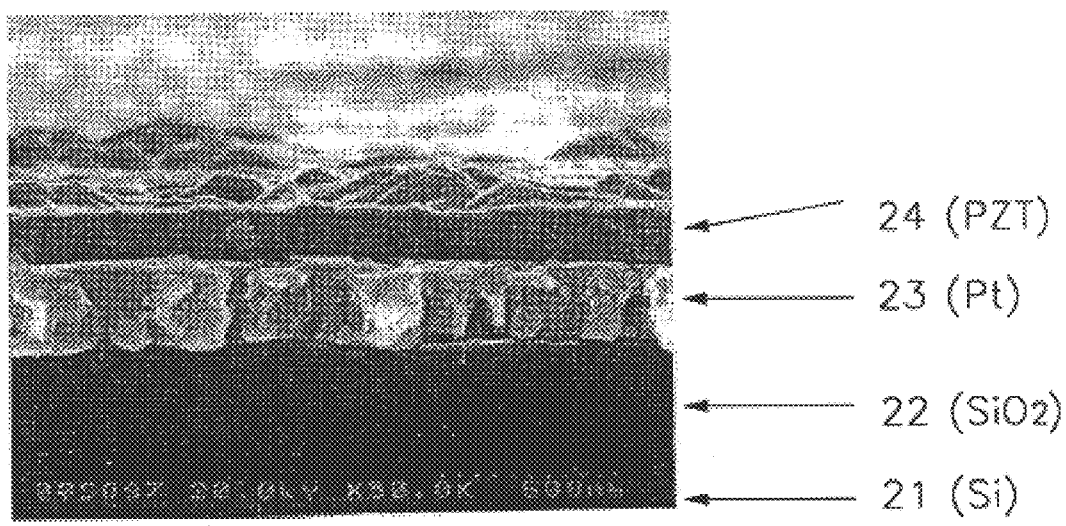
FIG. 2 is a scanning electron microscope (SEM) photograph illustrating the cross-section of the state where a PZT thin film is deposited on a conventional Pt substrate.
Figure 3A:
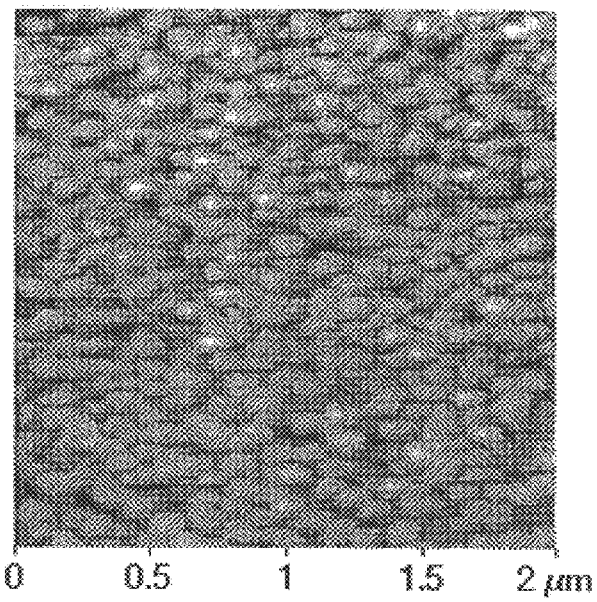
FIG. 3A is an atomic force microscope (AFM) photograph illustrating the surface state of the Pt substrate shown in FIG. 2.
Figure 3B:
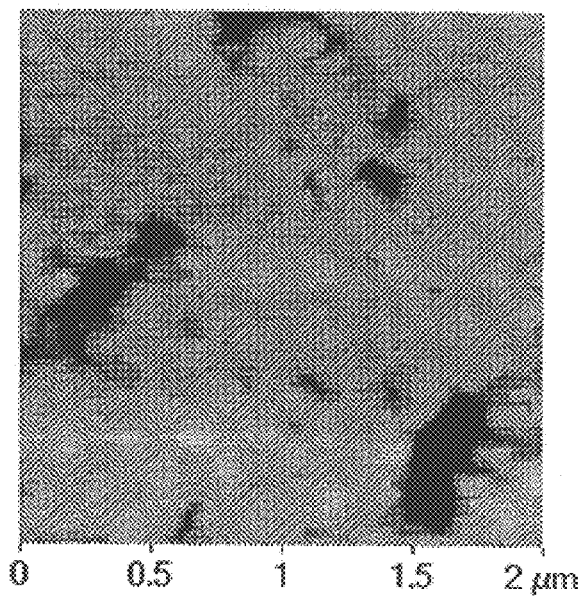
FIG. 3B is an atomic force microscope (AFM) photograph illustrating a change in the surface state observed after the Pt substrate shown in FIG. 3A is pre-heated.
Figure 7A:
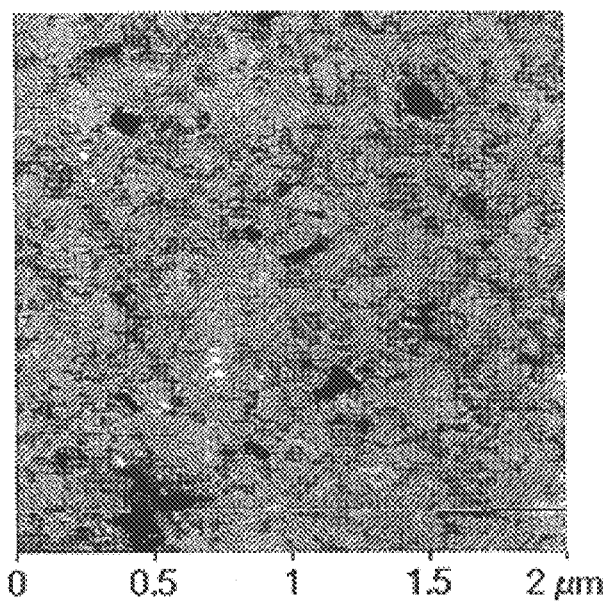
FIG. 7A is an atomic force microscope (AFM) photograph illustrating the substrate surface state where a PbO seed layer according to the present invention is coated on the Pt substrate shown in FIG. 7A.
Figure 7B:
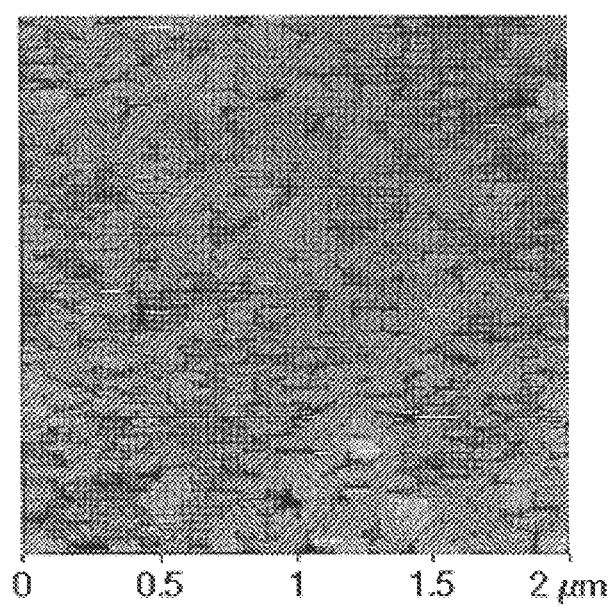
FIG. 7B is an atomic force microscope (AFM) photograph illustrating the surface state observed after the substrate coated with the PbO seed layer shown in FIG. 7A is pre-heated.
Figure 8:
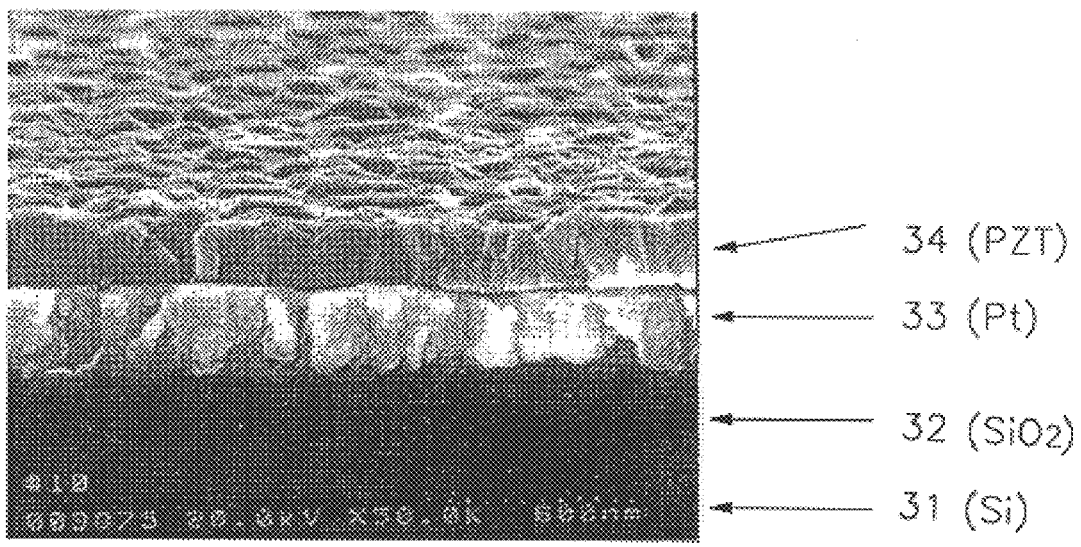
FIG. 8 is a scanning electron microscope (SEM) photograph illustrating the cross-section of the state where a PZT thin film is deposited on the Pt substrate coated with the PbO seed layer shown in FIG. 7A, according to the present invention.

First, the surface of the Pt electrode being in good condition before pre-heating, as shown in FIG. 3A, becomes defective after pre-heating at 600° C. for about 15 minutes, as shown in FIG. 3B. In other words, due to a difference between a deposition temperature of Pt and a pre-heating temperature, while the Pt electrode experiences grain growth, thermal expansion/contraction, diffusion, oxidation, etc., it will have larger grains, intercrystalline defects increases, the surface thereof is turned to be rough, which are impediments to growth of the PZT thin film. However, PbO is deposited on the Pt electrode (FIG. 3A) at 400–500° C. to a thickness of 50–500 nm, as shown in FIG. 7A, and then the resultant structure is pre-heated, the surface of the Pt electrode is maintained at the initial state shown in FIG. 3A without defect, as shown in FIG. 7B. Thus, the PZT thin film growing on a substrate having the smooth surface as shown in FIG. 7B consists of uniform grains, compared to that (24 of FIG. 2) grown on a substrate having the deformed surface as shown in FIG. 3B, as shown in FIG. 8, and the surface roughness thereof is also kept in good condition.

According to a second embodiment of the present invention, as a seed layer, a PZT thin film is first formed such that an excess Pb precursor, that is, in a larger amount than other metal precursors including Zr or Ti, is injected into a chamber, and then PZT is further grown thereon. In other words, when the PbO seed layer is formed using a MOCVD method, in addition to the Pb organic compound gas, Zr and Ti organic compound gases are simultaneously injected to the chamber to form a PZT seed layer, where excess Pb is injected such that the injection ratio of Pb to Zr and Ti, that is, Pb/(Zr+Ti) for forming the seed layer, is greater than that for forming a PZT thin film in a subsequent step. More Pb than needed for forming the PZT thin film is supplied into the chamber for the purpose of preventing a pyrochlore phase from being produced due to lack of Pb. Once a pyrochlore phase is produced, it cannot be converted into a perovskite phase even if Pb is added later. Also, a pyrochlore phase grows easily on a pyrochlore phase and this is also true of a perovskite phase. Here, the amount of Pb supplied during formation of the PZT seed layer will be described further from a quantitative point of view. The amount of Pb supplied for forming the PZT seed layer is 5–50% larger than that supplied for forming the PZT thin film growing in a later step. More clearly, the injection ratio of Pb to Zr and Ti, Pb/(Zr+Ti), supplied for forming the PZT seed layer, is 1.05–1.5, larger than that supplied for forming the PZT thin film growing in a later step. The thickness of the PZT seed layer is preferably 3–40 nm. Here, the added amount of Pb and the thickness of the seed layer vary depending on the substrate state and the processing conditions, e.g., processing temperature. Also, since surplus Pb is absorbed into the substrate to be consumed or evaporated, the PZT seed layer is formed of a good-quality perovskite phase without or with negligible amount of foreign matter such as PbO.

If the PZT seed layer is formed in such a manner, the PZT thin film is formed thereon. Here, the source gases supplied must be in an appropriate ratio, so that the ratio of the Pb content to the sum of Zr and Ti contents in the PZT film, that is, Pb: (Zr+Ti) in the PZT film, is 1 to 1, As a result, when forming the PZT thin film, Pb is supplied 5–50% less than the case when forming the PZT seed layer.

Figure 9:
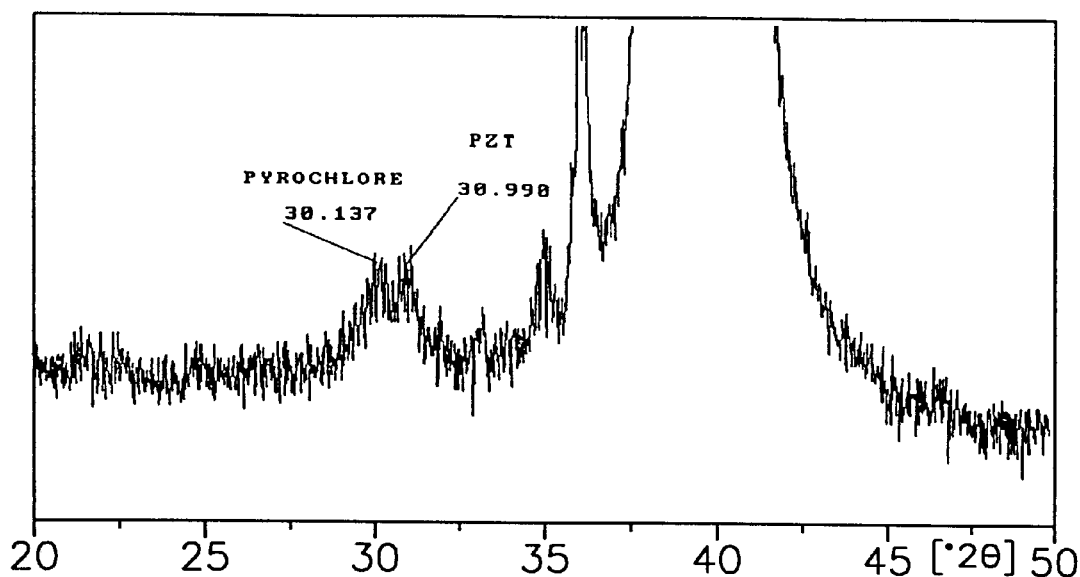
FIG. 9 shows an X-ray diffraction (XRD) measurement result of a PZT thin film (sample A) produced by a conventional method.
Figure 10:
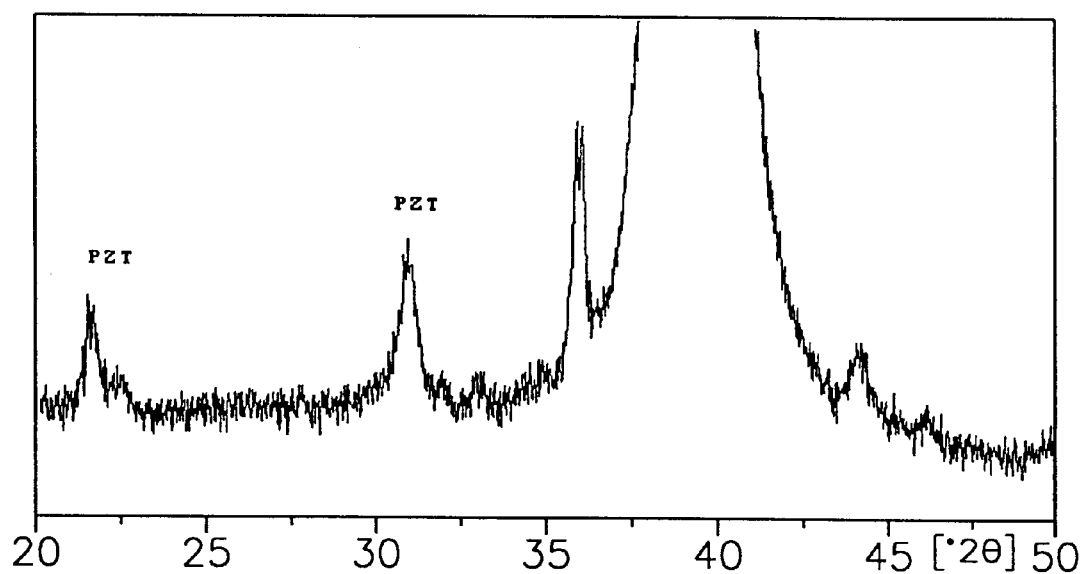
FIG. 10 shows an X-ray diffraction (XRD) measurement result of a PZT thin film (sample B) produced by injecting excess Pb consistently by a conventional method.
Figure 11:
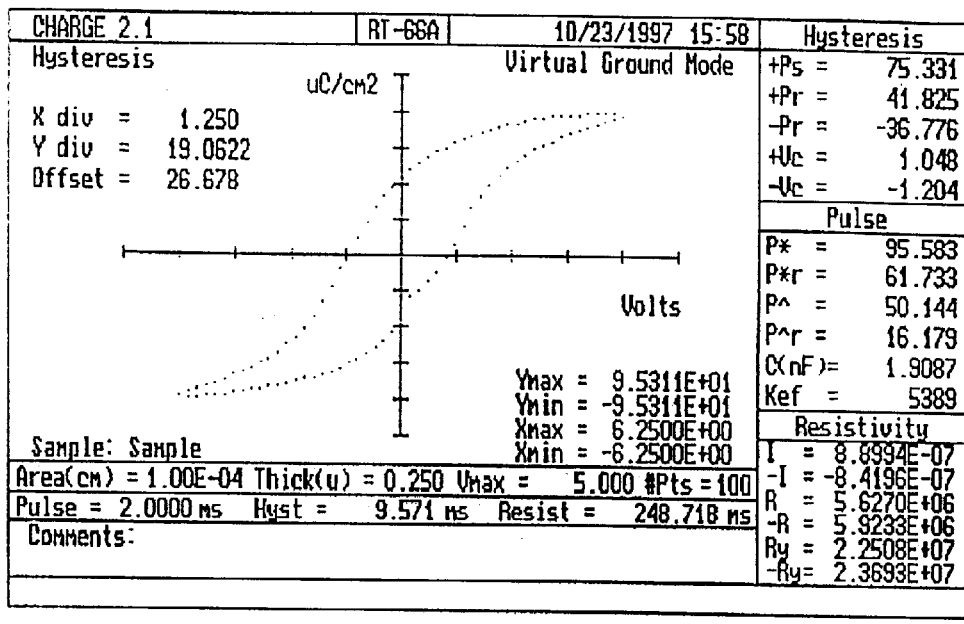
FIG. 11 shows a measurement result of electrical properties of the PZT thin film (sample B) shown in FIG. 10.
Figure 12:
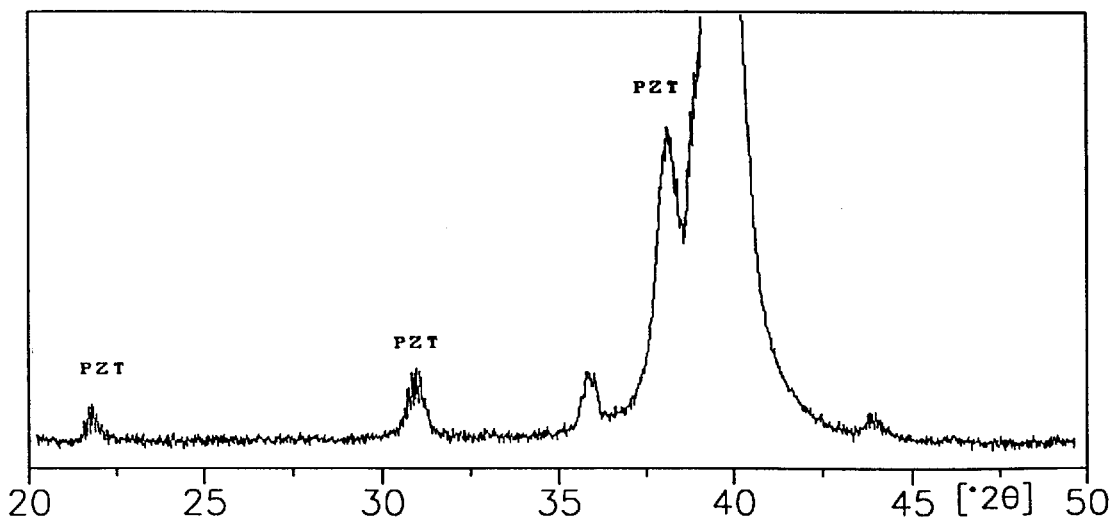
FIG. 12 shows an X-ray diffraction (XRD) measurement result of a PZT thin film (sample C) produced by varying compositions of a seed layer and a PZT thin film, according to the present invention.
Figure 13:
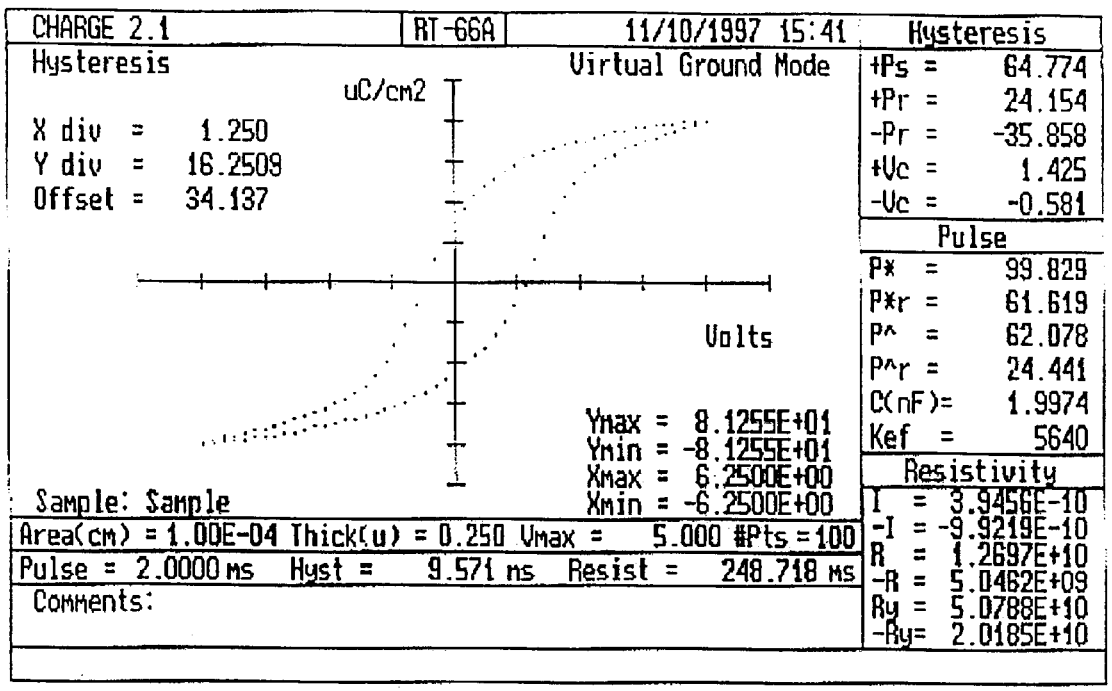
FIG. 13 shows a measurement result of electrical properties of the PZT thin film (sample C) shown in FIG. 12.

FIGS. 9 through 13 show X-ray diffraction (XRD) measurement results of PZT thin films produced by a conventional method and according to the present invention, and measurement results of electrical properties of the PZT thin films. In detail, FIG. 9 shows an X-ray diffraction (XRD) measurement result of a PZT thin film (Sample A) produced by a conventional method, FIG. 10 shows an X-ray diffraction (XRD) measurement result of a PZT thin film (sample B) produced by injecting excess Pb consistently by a conventional method, FIG. 11 shows a measurement result of electrical properties of the PZT thin film (sample B) shown in FIG. 10, FIG. 12 shows an X-ray diffraction (XRD) measurement result of a PZT thin film (sample C) produced by varying compositions of a seed layer and a PZT thin film, and FIG. 13 shows a measurement result of electrical properties of the PZT thin film (sample C) shown in FIG. 12. Here, the applied growth conditions of the PZT thin film are demonstrated in the following table 1.

Table 1. Growth Conditions of PZT Thin Film

| Sample | Composition of source gases injected into processing chamber for forming seed layer | Composition of source gases injected into processing chamber for forming PZT thin film | Thickness of PZT thin film (nm) |
|---|---|---|---|
| A | None | Pb:Zr:Ti = 36:55:30 | 240 |
| B | None | Pb:Zr:Ti = 40:55:30 | 240 |
| C | Pb:Zr:Ti (70:55:30) | Pb:Zr:Ti = 36:55:30 | Seed layer + PZT thin film = 20 + 220 |

(For all samples, the deposition temperature was set to 600° C. and the ratio of carrier gas to oxidizing gas supplied, that is, nitrogen to oxygen, was 1000 sccm to 1000 sccm.)

Referring to FIG. 9 showing an XRD measurement result of a PZT thin film (Sample A) produced by supplying gases in a constant composition ratio, irrespective of an initial stage or a later stage, by a conventional method, Pb becomes deficient in the thin film formed in the vicinity of an interface between PZT and Pt. Thus, both a perovskite phase and a pyrochlore phase were observed. To avoid this problem, if the amount of Pb was simply added, a PZT thin film (sample B) consisting of only a perovskite phase could be obtained, as shown in FIG. 10. However, in this case, as shown in FIG. 11, the electrical resistance of the formed PZT thin film decreased.

Therefore, as described above, if the composition ratios of organic metal compound gases injected for forming a PZT seed layer and for forming a PZT thin film were made different from each other (sample C), the PZT thin film consisting of only a perovskite phase without a pyrochlore phase, as shown in FIG. 12, and having excellent electrical characteristic, as shown in FIG. 13, was obtained with the same amount of Pb as in the sample A.

As described above, according to the method for forming a PZT thin film using a seed layer of the present invention, the PZT thin film is grown on a PbO seed layer or a PZT seed layer, thereby facilitating creation of PZT nucleus to help small and uniform PZT grains grow. Also, the seed layer serves to protect the surface of an electrode (Pt), thereby maintaining the evenness of an electrode surface, which reduces the surface roughness of the PZT thin film formed thereon. Since the grains of the PZT thin film are small and uniform, the surface roughness thereof is improved, so that subsequent processes are easily performed in device fabrication. Also, since interface defects between the PZT thin film and the upper electrode are reduced, device characteristics are improved. Further, creation of an undesirable second phase such as a pyrochlore is suppressed by using the PbO seed layer or the PZT seed layer consisting of a perovskite phase, and creation of a nucleus consisting of a pure perovskite phase is facilitated, thereby improving ferroelectricity and uniformity of the PZT thin film.

What is claimed is:

1. A method for forming a PZT thin film using a seed layer, comprising the steps of:

forming an electrode on a substrate;

forming a PbO seed layer on the electrode by injecting a Pb precursor into a chamber wherein oxygen source exists; and forming a PZT thin film on the PbO seed layer, wherein the PbO seed layer is formed to a thickness of 5–50 nm at a temperature of 420–480° C.

2. The method according to claim 1, wherein the electrode is formed of platinum (Pt).

3. The method according to claim 2, wherein the step of forming the PbO seed layer is performed using a metal organic chemical vapor deposition method or a sputtering method.

4. The method according to claim 3, wherein in the step of forming the PbO seed layer, Zr and Ti precursors are simultaneously injected into the chamber in addition to the Pb precursor using the metal organic chemical vapor deposition method, to form a PZT seed layer, where excess Pb is injected into the chamber such that the injection ratio of Pb to Zr and Ti, Pb/(Zr+Ti), for forming the seed layer, is greater than that for forming the PZT thin film.

5. The method according to claim 4, wherein the injection ratio of Pb to Zr and Ti, Pb/(Zr+Ti), supplied for forming the PZT seed layer, is 1.05–1.5, larger than that supplied for forming the PZT thin film growing in a later step.

6. The method according to claim 2, wherein the step of forming the PZT thin film is performed using a metal organic chemical vapor deposition method or a sputtering method.

7. The method according to claim 1, wherein a buffer layer is formed, instead of the electrode.

8. The method according to claim 7, wherein the buffer layer is formed of $TiO_2$.

9. The method according to claim 8, wherein the step of forming the PbO seed layer is performed using a metal organic chemical vapor deposition method or a sputtering method.

10. The method according to claim 9, wherein in the step of forming the PbO seed layer, Zr and Ti precursors are simultaneously injected into the chamber in addition to the Pb precursor using the metal organic chemical vapor deposition method, to form a PZT seed layer, where excess Pb is injected into the chamber such that the injection ratio of Pb to Zr and Ti, Pb/(Zr+Ti), for forming the seed layer, is greater than that for forming the PZT thin film.

11. The method according to claim 10, wherein the injection ratio of Pb to Zr and Ti, Pb/(Zr+Ti), supplied for forming the PZT seed layer, is 1.05–1.5, larger than that supplied for forming the PZT thin film growing in a later step.

12. The method according to claim 8, wherein the step of forming the PZT thin film is performed using a metal organic chemical vapor deposition method or a sputtering method.

13. The method according to claim 7, wherein the step of forming the PbO seed layer is performed using a metal organic chemical vapor deposition method or a sputtering method.

14. The method according to claim 13, wherein in the step of forming the PbO seed layer, Zr and Ti precursors are simultaneously injected into the chamber in addition to the Pb precursor using the metal organic chemical vapor deposition method, to form a PZT seed layer, where excess Pb is injected into the chamber such that the injection ratio of Pb to Zr and Ti, Pb/(Zr+Ti), for forming the seed layer, is greater than that for forming the PZT thin film.

15. The method according to claims 14, wherein the injection ratio of Pb to Zr and Ti, Pb/(Zr+Ti), supplied for forming the PZT seed layer, is 1.05–1.5, larger than that supplied for forming the PZT thin film growing in a later step.

16. The method according to claim 7, wherein the step of forming the PZT thin film is performed using a metal organic chemical vapor deposition method or a sputtering method.

17. The method according to claim 1, wherein the step of forming the PbO seed layer is performed using a metal organic chemical vapor deposition method or a sputtering method.

18. The method according to claim 17, wherein in the step of forming the PbO seed layer, Zr and Ti precursors are simultaneously injected into the chamber in addition to the Pb precursor using the metal organic chemical vapor deposition method, to form a PZT seed layer, where excess Pb is injected into the chamber such that the injection ratio of Pb to Zr and Ti, Pb/(Zr+Ti), for forming the seed layer, is greater than that for forming the PZT thin film.

19. The method according to claim 18, wherein the injection ratio of Pb to Zr and Ti, Pb/(Zr+Ti), supplied for forming the PZT seed layer, is 1.05–1.5, larger than that supplied for forming the PZT thin film growing in a later step.

20. The method according to claim 1, wherein the step of forming the PZT thin film is performed using a metal organic chemical vapor deposition method or a sputtering method.

\* \* \* \* \*